(12) United States Patent
Shinohara

(10) Patent No.: US 6,265,755 B1
(45) Date of Patent: Jul. 24, 2001

(54) SEMICONDUCTOR INTEGRATED CIRCUIT COMPRISING MIS CAPACITORS

(75) Inventor: Mamoru Shinohara, Tokyo (JP)

(73) Assignee: Sony Corporation, Tokyo (JP)

( * ) Notice: Subject to any disclaimer, the term of this patent is extended or adjusted under 35 U.S.C. 154(b) by 706 days.

(21) Appl. No.: 08/557,484

(22) Filed: Nov. 14, 1995

(30) Foreign Application Priority Data

Nov. 14, 1994 (JP) ............................................. P06-278741

(51) Int. Cl.⁷ ............................ H01L 29/92; H01L 27/02
(52) U.S. Cl. ......................... 257/532; 257/528; 257/535
(58) Field of Search ................................. 257/532, 528, 257/535

(56) References Cited

U.S. PATENT DOCUMENTS 5,124,761 * 6/1992 Senuma et al. ..................... 257/535
5,395,782 * 3/1995 Ohkoda et al. ....................... 437/47
5,414,291 * 5/1995 Miwa et al. ........................ 257/370

FOREIGN PATENT DOCUMENTS

0188353 * 8/1987 (JP) ..................................... 257/532
0029962 * 2/1988 (JP) ..................................... 257/535
0196583 * 7/1992 (JP) ..................................... 257/532

* cited by examiner

*Primary Examiner*—Nathan Flynn
(74) *Attorney, Agent, or Firm*—Sonnenschein, Nath & Rosenthal

(57) ABSTRACT

A semiconductor integrated circuit having an MIS (metal-insulator silicon) capacitor. A first capacitor and a second capacitor are connected in series between a substrate terminal and the MIS capacitor. A power supply is connected between the first and second capacitors. This power supply controls the potential between the first and second capacitors to an arbitrary potential to prevent a digital signal transmitted to the substrate from entering to an external circuit connected with the MIS capacitor.

9 Claims, 5 Drawing Sheets

SEMICONDUCTOR INTEGRATED CIRCUIT COMPRISING MIS CAPACITORS

FIELD OF THE INVENTION

The present invention relates to a semiconductor integrated circuit having MIS (metal-insulator silicon) capacitors and also to a semiconductor device having such a circuit.

BACKGROUND OF THE INVENTION

FIG. 5 is a cross-sectional view of main portions of a semiconductor device equipped with a conventional MIS capacitive element. This semiconductor device comprises a substrate on which complementary MOS (CMOS) devices (not shown) are fabricated. This structure comprises the p-type silicon substrate 50 having a region over which the MIS capacitive element is to be formed. An n-type epitaxial layer 51 is formed in this region over the p-type substrate 50. A LOCOS oxide film 52 is formed on the surface of the epitaxial layer 51 so as to surround both a region in which the bottom electrode of the MIS capacitive element is to be formed and a region in which a contact is to be formed. An n-type doped layer 53a for the bottom electrode of the MIS capacitive element and an n-type doped layer 53b for the contact are formed in and on the epitaxial layer 51 surrounded by the LOCOS oxide film 52.

A silicon nitride (SiN) film 54 and a boro-phosphosilicate glass (BPSG) 55 are successively laminated on the LOCOS oxide film 52 so as to cover the surface of the epitaxial layer 51. In this structure, an oxide film 56 is interposed between the n-type doped layer 53b and the SiN film 54.

Those portions of the BPSG film 55 which are located just above the n-type doped layer 53a are removed, thus forming windows 55a. An aluminum (Al) electrode 57a (first MIS terminal) is formed as a top electrode over the SiN film 55 inside the windows 55a. The first MIS terminal 57a is formed over the n-type doped layer 53a via the SiN film 54, whereby an MIS capacitor 60 is formed. Contact holes 58 in communication with the n-type doped layer 53b are formed in the oxide film 56, in the SiN film 54, and in the BPSG film 55 which are located over the n-type doped layer 53b. An aluminum (Al) electrode (second MIS terminal) 57b is formed over the BPSG film 55 so as to fill in the contact holes 58. Thus, a contact is formed.

The circuit of the above-described conventional semiconductor device is shown in FIG. 6. A parasitic junction capacitance 61 formed between the n-type epitaxial layer 51 and the p-type Si substrate 50 shown in FIG. 5 exists between a substrate terminal 50a and the second MIS terminal 57b. Generally, the impedance Z of an RC series circuit decreases as the capacitance C is increased, as given by $$Z = \{R^2 + (1/\omega C)^2\}^{1/2}$$

where R is a resistance and ω is an angular velocity.

Accordingly, if the CMOS devices (not shown) formed on the substrate on which the MIS capacitor 60 is also formed operate, and if digital signals are transmitted to the substrate terminal 50a from the CMOS devices, then the digital signals pass through the parasitic junction capacitance 61 and go to the second MIS terminal 57b, as indicated by the arrow. As a result, the digital signals, or noises, enter a separate circuit connected with the MIS capacitive element, creating a crosstalk.

SUMMARY OF THE INVENTION

The present invention has been made to solve the foregoing problem.

It is an object of the present invention to provide a semiconductor integrated circuit for preventing crosstalk of a digital signal transmitted to its substrate to other circuit connected with an MIS capacitive element.

It another object of the invention to provide a semiconductor device for preventing crosstalk of a digital signal transmitted to its substrate to other circuit connected with an MIS capacitive element.

A semiconductor integrated circuit according to the present invention comprises a substrate terminal, an MIS capacitor, a first capacitor, a second capacitor, and a power supply. The first and second capacitors are connected in series between the substrate terminal and the MIS capacitor. The power supply is connected between the first and second capacitors and controls the potential between the first and second capacitors to a desired potential.

A semiconductor device according to the invention is fabricated in the manner described now. A first layer is formed on a semiconductor base in such a way that the first layer is electrically insulated from the base. A second layer consisting of a dielectric material is formed on the first layer. An MIS capacitor is formed on the second layer. A bottom electrode having a desired pattern is formed on the second layer. A top electrode is formed over the bottom electrode via a dielectric film, thus forming the MIS capacitor. Contact holes reaching the first layer are formed in the second layer and in the dielectric film outside the region where the MIS capacitor is formed. A potential control electrode connected with the power supply is formed on the dielectric film so as to cover the inner surfaces of the contact holes. In this way, the first layer is controlled to any arbitrary potential.

For example, a semiconductor layer or dielectric layer of the opposite conductivity type to the semiconductor base is used as the first layer.

In the novel circuit, the potential between the first and second capacitors is controlled to any arbitrary value by the power supply and, therefore, even if a digital signal coming from other device is transmitted to the substrate terminal, the signal is withdrawn by the power supply through the first capacitor. Consequently, the digital signal which is transmitted to the substrate terminal and passed through the first capacitor is prevented from passing through the second capacitor; otherwise the signal would enter the MIS terminal connected between the second capacitor and the MIS capacitor.

In the novel device, the first capacitor is formed between the semiconductor base and the first layer. The second capacitor is formed between the first layer and the bottom electrode by the second layer made from a dielectric material. The first layer is connected with the potential control electrode which is formed so as to cover the inner surfaces of the contact holes. Therefore, the first layer is controlled to any desired potential. Consequently, even if a digital signal transmitted to the semiconductor base passes through the first capacitor, the signal is removed by the potential control electrode from the first layer. Hence, the digital signal does not enter the contact connected with the first layer.

Other objects and features of the invention will appear the course of the description thereof, which follows.

DETAILED DESCRIPTION OF THE INVENTION

Figure 1:
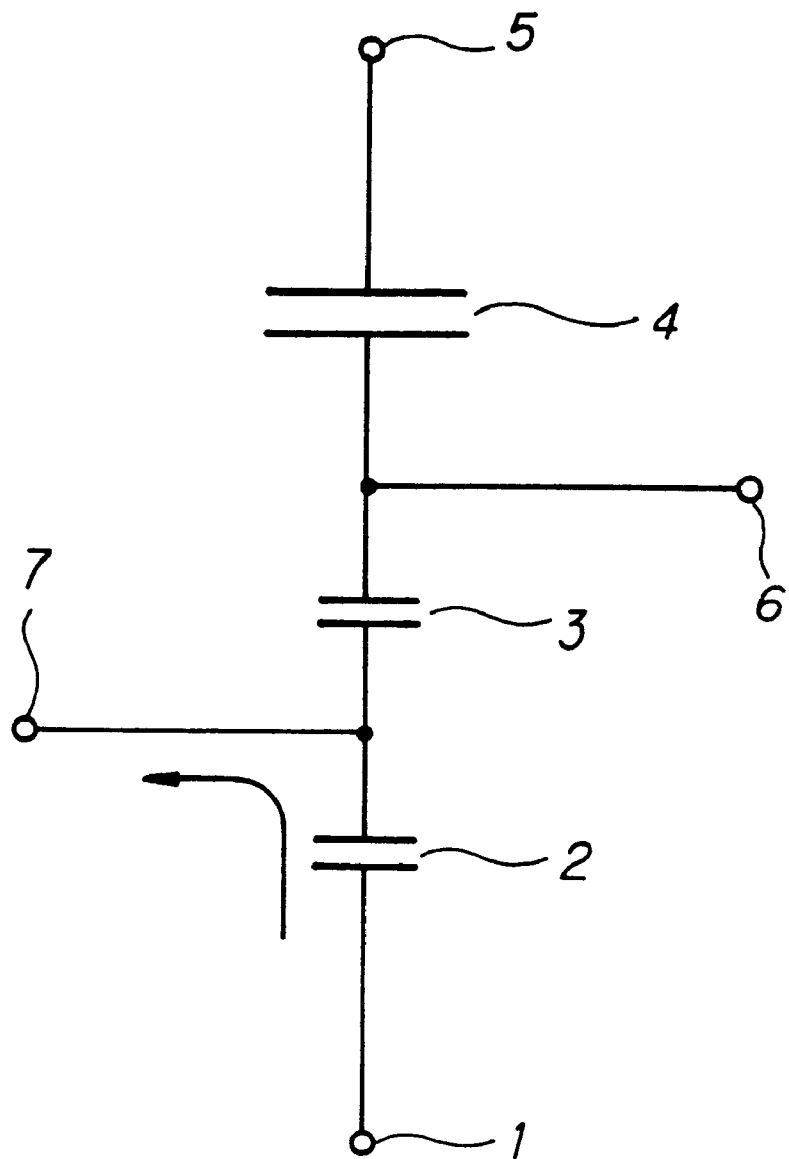
FIG. 1 is a diagram of a circuit according to the present invention.

FIG. 1 is a diagram of a semiconductor integrated circuit embodying the concept of the present invention. This circuit comprises a substrate terminal 1, a first capacitor 2 connected with the substrate terminal 1, a second capacitor 3 connected in series with the first capacitor 2, an MIS capacitor 4 having a first MIS terminal 5 and connected in series with the second capacitor 3, and a second MIS terminal 6 connected between the MIS capacitor 4 and the second capacitor 3. A power supply 7 for controlling the potential between the first capacitor 2 and the second capacitor 3 to an arbitrary potential is connected between the first capacitor 2 and the second capacitor 3. A separate circuit (not shown) is connected with the second MIS terminal 6.

In this circuit, the power supply 7 connected between the first capacitor 2 and the second capacitor 3 controls the potential between the first capacitor 2 and the second capacitor 3 to an arbitrary potential. Therefore, if a digital signal is transmitted to the substrate terminal 1 from the separate circuit (not shown), the signal passes through the first capacitor 2 and is withdrawn by the power supply 7 as indicated by the arrow. That is, if digital noise is transmitted from the separate circuit (not shown) to the substrate terminal 1 and passes through the first capacitor 2, the noise is extracted by the power supply 7 and so the noise is prevented from entering the second MIS terminal 6.

Accordingly, in this circuit, digital noise transmitted to the substrate terminal 1 is prevented from entering the separate circuit (not shown) connected to the second MIS terminal 6, thus preventing crosstalk.

Figure 2:
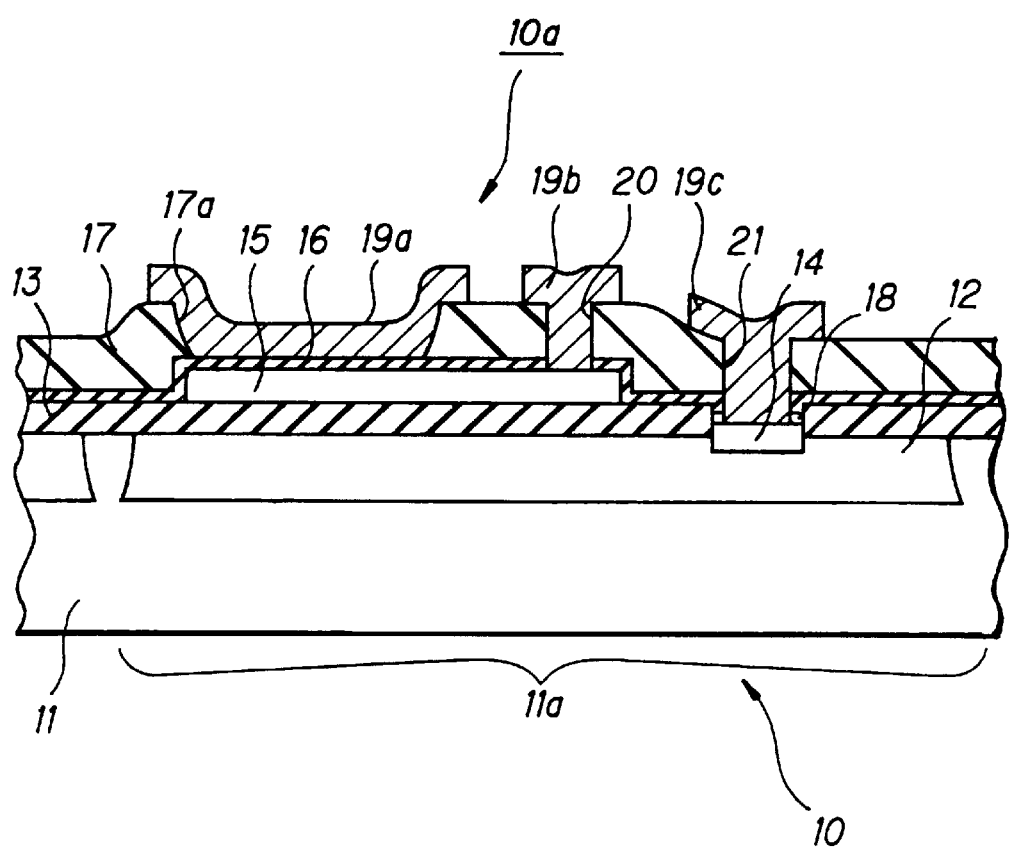
FIG. 2 is a cross-sectional view of main portions of a semiconductor device according to the invention.

A semiconductor device according to the present invention is next described by referring to the cross section of FIG. 2. This semiconductor device, generally indicated by reference numeral 10, comprises a semiconductor base 11 on which an MIS capacitive element 10a having the aforementioned circuit is formed. The semiconductor base 11 consists of a p-type silicon substrate. The base 11 has a region 11a over which the MIS capacitive element is to be formed. An n-type epitaxial layer 12 is formed as a first layer on the region 11a. The epitaxial layer 12 contains an n-type dopant at a dopant concentration, for example, of about $1 \times 10^{16}$ cm$^{-3}$, and is electrically insulated from the p-type semiconductor base 11.

A LOCOS oxide film 13 made from a dielectric material is formed as a second layer on the surface of the epitaxial layer 12. This LOCOS oxide film 13 is formed so as to surround a region in which a contact is to be formed, the contact being formed in the aforementioned region 11a where the MIS capacitive element is to be formed. An n-type doped layer 14 is formed on top of the epitaxial layer 12 in the region in which the contact is to be formed.

An n-type polysilicon layer 15 becoming the bottom electrode of the MIS capacitor is formed on the LOCOS oxide film 13. A dielectric film 16 made from SiN and a BPSG film 17 are successively formed over the LOCOS oxide film 13 so as to cover the polysilicon layer 15. An oxide film 18 is formed between the n-type doped layer 14 and the dielectric film 16.

The BPSG film 17 is provided with windows 17a at given locations over the polysilicon layer 15. An Al electrode (first MIS terminal) 19a becoming the top electrode of an MIS capacitor is formed in the windows 17a over the dielectric film 16. That is, the Al electrode 19a is formed over the n-type polysilicon layer 15 via the dielectric film 16. Thus, the MIS capacitor is formed.

Contact holes 20 reaching the polysilicon layer 14 are formed in the dielectric film 16 and in the BPSG film 17 in locations different from the locations where the Al electrode 19a is formed. Another Al electrode (second MIS terminal) 19b is formed over the BPSG film 17 so as to fill in the contact holes 20.

Other contact holes 21 are formed in the oxide film 18, in the dielectric film 16, and in the BPSG film 17 in regions where contacts are to be formed, the regions being surrounded by the LOCOS oxide film 13. The contact holes 21 reach the n-type doped layer 14 formed on the epitaxial layer 12. An Al electrode 19c for making a contact is formed over the BPSG film 17 so as to fill in the contact holes 21. This Al electrode 19c is connected with a power supply (not shown) for controlling the epitaxial layer 12 to an arbitrary potential. In this structure, the Al electrode 19c serves as a potential control electrode.

A method of fabricating the semiconductor device 10 constructed as described above is now described by referring to FIGS. 3(a)–3(c) which illustrate the process sequence. As an example, the MIS capacitive element 10a and a CMOS transistor 10b are formed on the same semiconductor base 11.

Figure 3A:
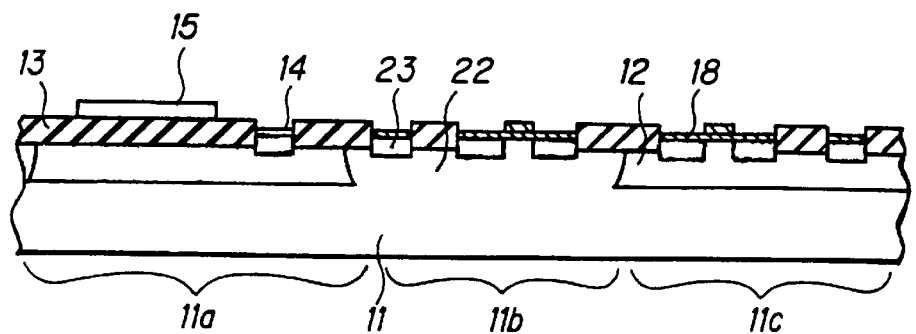
FIGS. 3(a)–3(c) are cross-sectional views of the semiconductor device shown in FIG. 2, illustrating successive steps for fabricating the device.

Referring to FIG. 3(a), the n-type epitaxial layer 12 is epitaxially grown on the surface of the semiconductor base 11 in the region 11a where the MIS capacitive element is to be formed, and also in the region 11c where a PMOS transistor is to be formed. A p-well 22 is formed by ion implantation in the surface of the semiconductor base 11 in regions excluding the regions 11a and 11c where the MIS capacitive device and the PMOS transistor, are to be formed, respectively.

Thereafter, a LOCOS oxide film 13 is formed over the epitaxial layer 12 and over the p-well 22 so as to surround the regions 11b and 11c by LOCOS technology. In these regions 11b and 11c, the NMOS and PMOS transistors are to be formed, respectively. At this time, the LOCOS oxide film 13 is formed so as to surround regions in which contacts are to be formed, the contacts being formed in the regions 11a, 11b, and 11c where the MIS capacitive element, the NMOS transistor, and the PMOS transistor are to be formed, respectively.

Subsequently, an oxide film 18 is formed over the whole surface by thermal oxidation. This oxide film 18 becomes a gate oxide film in regions 11b and 11c where the NMOS and the PMOS transistors are to be formed, respectively.

Then, an n-type polysilicon is deposited over the whole surface by CVD. Thereafter, a polysilicon pattern 15 is formed in these regions 11a, 11b, and 11a by lithography and etching. The patterned polysilicon layer 15 forms the bottom electrode of the MIS capacitor in the region 11a where the MIS capacitive element is to be formed. The patterned polysilicon layer 15 forms gate electrodes in the regions 11b and 11c where the NMOS and PMOS transistors are to be formed.

Thereafter, a p-type doped layer 23 is formed by ion implantation in the p-well 22 in the region 11b where the NMOS transistor is to be formed. Also, the doped layer 23 is formed on the epitaxial layer 12 in the source/drain region of the region 11c where the PMOS transistor is to be formed. An n-type doped layer 14 is formed by ion implantation on the epitaxial layer 12 in the region where the contacts are to be formed in the region 11a in which the MIS capacitive element is to be formed. The n-type doped layer 14 is also formed in the p-well 22 in the source/drain region in the region 11b where the NMOS transistor is to be formed.

Figure 3B:
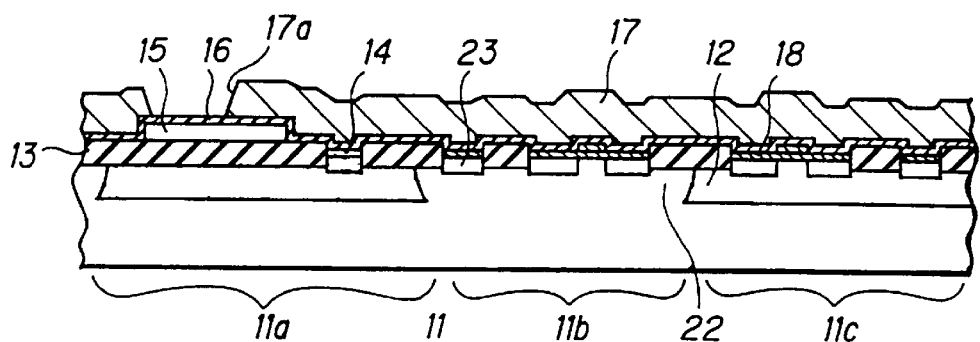

Then, as shown in FIG. 3(b), a dielectric film 16 consisting of SiN is formed over the whole surface of the LOCOS oxide film 13 by CVD so as to cover the surfaces of the polysilicon layer 15 and oxide film 18. A BPSG film 17 is formed on the dielectric film 16 by CVD. Thereafter, windows 17a are formed in the BPSG film 17 above the polysilicon film 15 becoming the bottom electrode of the MIS capacitor by lithography and etching.

Figure 3C:
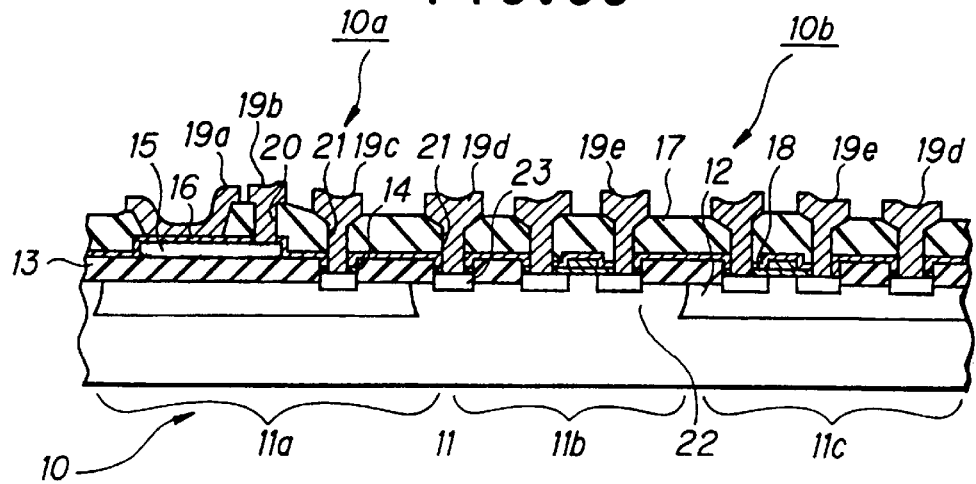

As shown in FIG. 3(c), contact holes 20 are then formed by lithography and etching in the BPSG film 17 and in the dielectric film 16 in the region 11a where the MIS capacitive element is to be formed, excluding the windows 17a. The contact holes 20 extend to the polysilicon layer 15. Furthermore, contact holes 21 reaching the n-type doped layer 14 or the p-type doped layer 23 are formed on the oxide film 18, on the dielectric film 16, and on the BPSG film 17 over the n-type doped layer 14 or the p-type doped layer 23 formed in the regions 11a, 11b, and 11c where the MIS capacitive element, the NMOS transistor, and the PMOS transistor are to be formed, respectively.

Subsequently, an Al film is formed over the BPSG film 17 so as to fill in the windows 17a and in the contact holes 20, 21. The Al film is patterned by lithography and etching. In this way, an Al electrode 19a becoming the top electrode of the MIS capacitor is formed. Also, an Al electrode 19b becoming the second MIS terminal and an Al electrode 19c becoming a potential control electrode are formed. Furthermore, Al electrodes 19d for contacts of the PMOS and NMOS transistors are formed. Moreover, Al electrodes 19e for source/drain electrodes are formed. By the manufacturing steps described thus far, the semiconductor device 10 in which the CMOS transistor 10b is formed together with the MIS capacitive element 10a on the same semiconductor base 11 is fabricated.

In the semiconductor device 10 manufactured in this way, a parasitic junction capacitance is formed between the semiconductor base 11 and the n-type epitaxial layer 12, in the same way as in the prior art techniques. A parasitic oxide film capacitance is created due to the LOCOS oxide film 13 between the n-type epitaxial layer 12 connected with the Al electrode 19b of the second MIS terminal and the polysilicon layer 15. Since the Al electrode 19c which is a potential control electrode is connected to the n-type doped layer 14 of the n-type epitaxial layer 12, the epitaxial layer 12 is controlled to an arbitrary potential via the Al electrode 19c.

That is, in the semiconductor device 10, the first capacitor 2 shown in FIG. 1 is formed by the above-described parasitic junction capacitance, and the second capacitor 3 is formed by the parasitic oxide film capacitor. The potential between these two parasitic capacitors is controlled to any arbitrary potential by the Al electrode 19c.

Therefore, if the digital signal transmitted to the region 11a on the semiconductor base 11 (substrate terminal) where the MIS capacitive element is to be formed passes through the parasitic junction capacitance, its digital signal is removed by the Al electrode 19c which is the potential control electrode. As a result, a digital signal arising from the other device formed on the same semiconductor base 11 is prevented from entering the Al electrode 19b of the second MIS terminal via the parasitic junction capacitor of the MIS capacitive element 10a and via the parasitic oxide film capacitance.

Accordingly, in this semiconductor device 10, even if a digital signal from the other device, such as a CMOS transistor, formed on the semiconductor base 11 is transmitted to the base 11, the signal can be removed by the Al electrode 19c before entering the parasitic oxide film capacitor. In consequence, crosstalk to the other circuit connected with the MIS capacitive element 10a is prevented.

In the above-described method of fabricating the semiconductor device 10, the bottom electrode of the MIS capacitor and the gate electrode of the CMOS transistor 10b are formed by the same polysilicon layer 15. Therefore, the semiconductor device 10 yielding the above-described advantages can be manufactured without extra steps.

In the semiconductor device 10 fabricated according to the present invention, the first layer formed on the semiconductor base is used as the epitaxial layer 12. The first layer is not limited to an epitaxial layer as long as the first layer is a semiconductor layer or dielectric layer of the opposite conductivity type to the semiconductor base.

Figure 4:
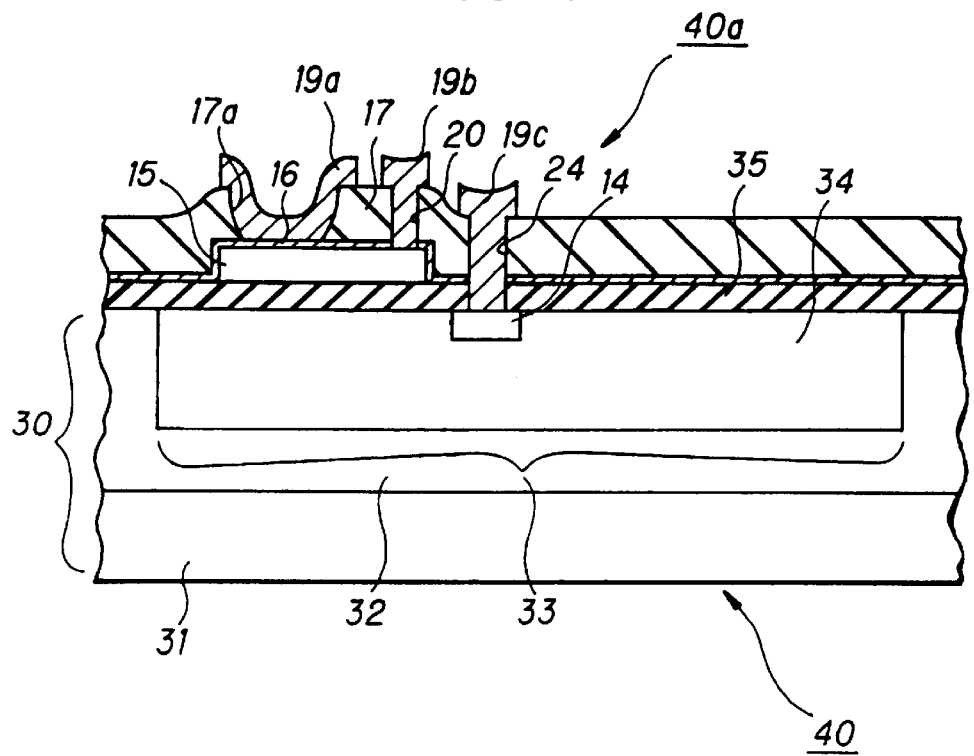
FIG. 4 is a cross-sectional view of main portions of another semiconductor device according to the invention.
Figure 5:
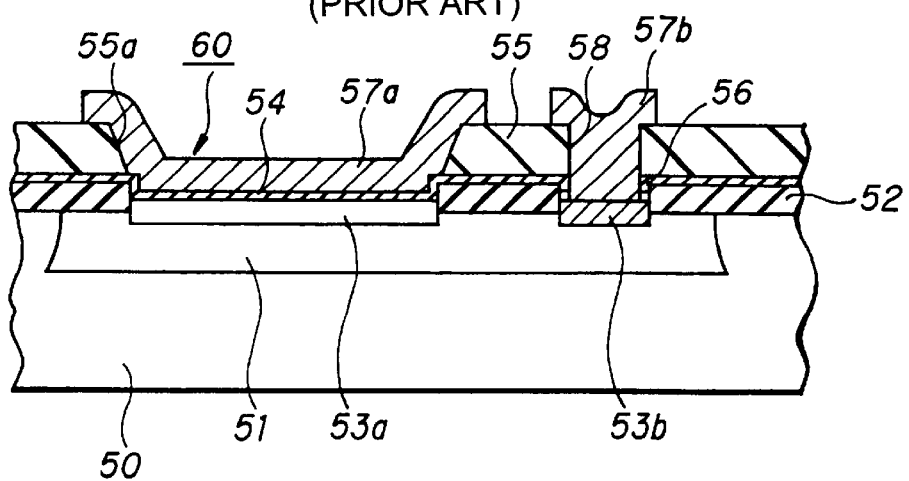
FIG. 5 is a cross-sectional view of main portions of a conventional semiconductor device.
Figure 6:
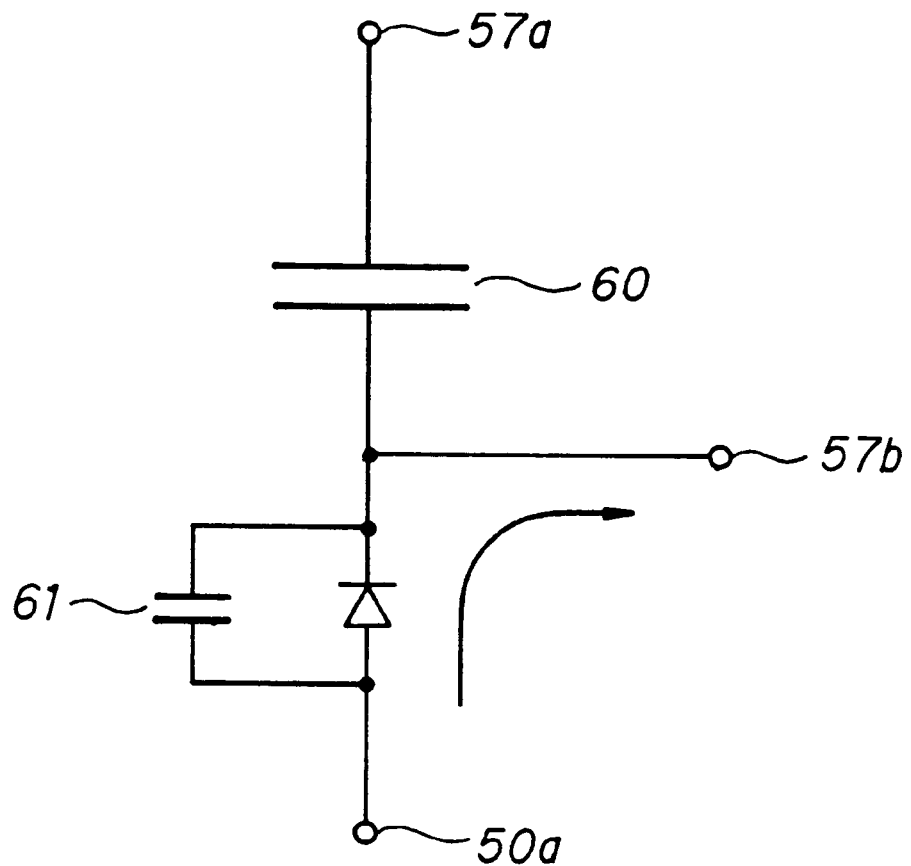
FIG. 6 is an equivalent circuit diagram of the conventional semiconductor device shown in FIG. 5.

FIG. 4 is a cross-sectional view of main portions of another device according to the present invention. This device is characterized in that the first layer is a dielectric layer. It is to be noted that like components are indicated by like reference numerals in various figures.

In this device shown in FIG. 4, the semiconductor device consists of an SOI (silicon-on-insulator) substrate 30 fabricated in the manner described below.

A Si substrate 31 has a bonded surface on which a silicon oxide ($SiO_2$) layer 32 is formed. This $SiO_2$ layer 32 has a region 33 over which a device is to be formed. An n-type Si layer 34 is formed in this region 33 of the $SiO_2$ layer 32 and surrounded by this $SiO_2$ layer 32.

This n-type Si layer 34 becomes the first layer of the novel device as described previously. In the SOI substrate 30 manufactured in this manner, a dielectric layer 35 made from $SiO_2$ is formed on the region 33 of the Si layer 34 over which the device is to be formed, and also on the other region of the $SiO_2$ layer 32.

An n-type doped layer 14 is formed on the region of the Si layer 34 over which a contact is to be made. A polysilicon layer 15 is formed on the region of the dielectric layer 35 over which an MIS capacitor is to be formed. A dielectric layer 16 of SiN and a film 17 of BPSG are successively formed over the dielectric layer 35 so as to cover the polysilicon layer 15.

In the same way as the device described already in conjunction with FIGS. 1 and 2, windows 17a are formed in the BPSG film 17. Contact holes 20 reaching the polysilicon layer 15 are formed in the dielectric film 16 and in the BPSG film 17. Contact holes 24 extending to the n-type doped layer 14 are formed in the dielectric film 16 and in the BPSG film 17. Al electrodes 19a, 19b, and 19c are formed in the windows 17a, contact holes 20, and 21, respectively, to fabricate an MIS capacitive element 40a.

In the above-described semiconductor device 40, the $SiO_2$ layer 32 forms the parasitic oxide film capacitor (first capacitor) between the Si substrate 31 and the Si layer 34. The dielectric layer 35 forms the parasitic oxide film capacitor (second capacitor) between the Si layer 34 and the n-type polysilicon layer 15 connected with the Al electrode 19b of the second MIS terminal. The Al electrode 19c which is a potential control electrode is connected with the n-type doped layer 14 of the n-type Si layer 34. The Si layer 34 is controlled to an arbitrary potential via the Al electrode 19c.

Therefore, if a digital signal from other device (not shown) formed on the same Si layer 34 is transmitted to the Si layer 34 (substrate terminal) and passes through the parasitic oxide film capacitor, or the first capacitor, the signal is withdrawn by the Al electrode 19c that is a potential control electrode. As a result, the digital signal from the other device formed on the same Si layer 34 is prevented from entering the Al electrode 19b of the second MIS terminal of the MIS capacitive element 40a. Consequently, in this semiconductor device 40, digital noise transmitted to the Si layer 34 is prevented from leaking to the other circuit connected with the MIS capacitive element 40a.

As described thus far, in the novel semiconductor integrated circuit, the potential between the first and second capacitors is controlled to an arbitrary value by the power supply connected between these two capacitors. Therefore, even if a digital signal from the other device is transmitted to the substrate terminal and passes through the first capacitor, the digital signal is prevented from passing into the MIS capacitive terminal connected between the second capacitor and the MIS capacitor. Hence, crosstalk of the digital signal from the substrate terminal to the other circuit via the MIS capacitive terminal can be prevented.

Furthermore, in the novel semiconductor device, the first capacitor is formed between the semiconductor base and the first layer. The second capacitor is formed by the second layer between the first layer and the bottom electrode. The first layer is controlled to an arbitrary potential by the power supply. Therefore, if a digital signal from the other device formed on the same semiconductor base is transmitted to the base and passes through the first capacitor, the signal is prevented from entering the contact connected with the first layer. In consequence, in this semiconductor device, crosstalk to the other circuit connected with the MIS capacitive element can be prevented.

What is claimed is:

1. A semiconductor device comprising:
   a first layer formed over a semiconductor base which is electrically insulated from said base;
   a second layer formed on said first layer comprised of a dielectric material;
   an MIS capacitor comprising a bottom electrode, a dielectric film formed on said second layer so as to cover said bottom electrode, and a top electrode formed on said dielectric film, said bottom electrode being formed over said second layer; and
   a potential control electrode electrically connected with said first layer connected to a reference potential-generating source for controlling said first layer to an arbitrary potential.

2. The semiconductor device of claim 1, wherein a MOS transistor having a gate electrode is formed on said semiconductor base on which said MIS capacitor is formed.

3. The semiconductor device of claim 1, wherein said first layer is comprised of a semiconductor layer of a conductivity type opposite to said semiconductor base.

4. The semiconductor device of claim 3, wherein a MOS transistor having a well of a conductivity type opposite to said semiconductor base is formed on said semiconductor base on which said MIS capacitor is formed.

5. The semiconductor device of claim 3, wherein a MOS transistor having a device-isolating film is formed on said semiconductor base on which said MIS capacitor is formed.

6. The semiconductor device of claim 1, wherein said first layer is comprised of a single-crystal of semiconductor material.

7. The semiconductor device of claim 6, wherein said semiconductor base and said first layer are made of layers of semiconductor materials which are bonded together.

8. A semiconductor device comprising:
   a silicon substrate;
   an $SiO_2$ layer formed on the substrate;
   a first doped region formed in the $SiO_2$ layer;
   a first dielectric layer formed over the $SiO_2$ layer;
   a second doped region formed in the first doped region;
   a bottom electrode formed on the first dielectric film;
   a second dielectric film formed over the bottom electrode and;
   a third dielectric film formed over the second dielectric film;
   first and second openings formed in the third dielectric film over the bottom electrode, said second opening continuing through the second dielectric to the bottom electrode;
   a third opening in the third dielectric continuing through the second dielectric and the first dielectric layer to the second doped region; and
   electrodes formed in the openings.

9. The semiconductor device of claim 8, wherein the electrode in the third opening is connected to a power supply.

* * * * *